United States Patent
Lee et al.

[11] Patent Number: 5,879,966
[45] Date of Patent: Mar. 9, 1999

[54] METHOD OF MAKING AN INTEGRATED CIRCUIT HAVING AN OPENING FOR A FUSE

[75] Inventors: Jin-Yuan Lee; Chue-San Yoo; Hsien Wei Chin, all of Hsin-Chu, Taiwan

[73] Assignee: Taiwan Semiconductor Manufacturing Company Ltd., Hsin-Chu, Taiwan

[21] Appl. No.: 301,536

[22] Filed: Sep. 6, 1994

[51] Int. Cl.$^6$ ..................................................... H01L 21/82
[52] U.S. Cl. ........................... 438/132; 438/601; 257/529; 148/DIG. 55
[58] Field of Search ..................... 437/922; 148/DIG. 55; 257/529; 438/132; 1/601

[56] References Cited

U.S. PATENT DOCUMENTS

| | | | |
|---|---|---|---|
| 4,536,949 | 8/1985 | Takayama et al. | 29/578 |
| 4,628,590 | 12/1986 | Udo et al. | 148/DIG. 55 |
| 5,025,300 | 6/1991 | Billig et al. | 357/51 |
| 5,241,212 | 8/1993 | Montonami et al. | 257/529 |

FOREIGN PATENT DOCUMENTS

| | | | |
|---|---|---|---|
| 0065545 | 4/1985 | Japan | 437/922 |
| 0128640 | 7/1985 | Japan | 148/DIG. 55 |
| 0154640 | 8/1985 | Japan | 148/DIG. 55 |
| 0022650 | 1/1986 | Japan | 437/922 |
| 0132451 | 6/1988 | Japan | 148/DIG. 55 |
| 0298738 | 12/1989 | Japan | 437/922 |

*Primary Examiner*—John F. Niebling
*Assistant Examiner*—Lynne A. Gurley
*Attorney, Agent, or Firm*—George O. Saile; Stephen B. Ackerman; William J. Stoffel

[57] ABSTRACT

An improved structure and method of forming a protective layer over an opening in insulation layers over a fuse is presented. The protective layer prevents contaminates from entering the exposed insulation layers in a fuse opening while not interfering with the laser trimming of the fuse. An opening through the layers over a fuse is made forming vertical sidewalls which expose portions of the insulation layers. A protective layer is formed over the insulation layer, the sidewalls and fuse thus preventing contaminates from diffusing into the exposed insulation layers. A second opening is made in the protective layer over the fuse link to allow a laser beam to melt the underlying fuse link.

7 Claims, 4 Drawing Sheets

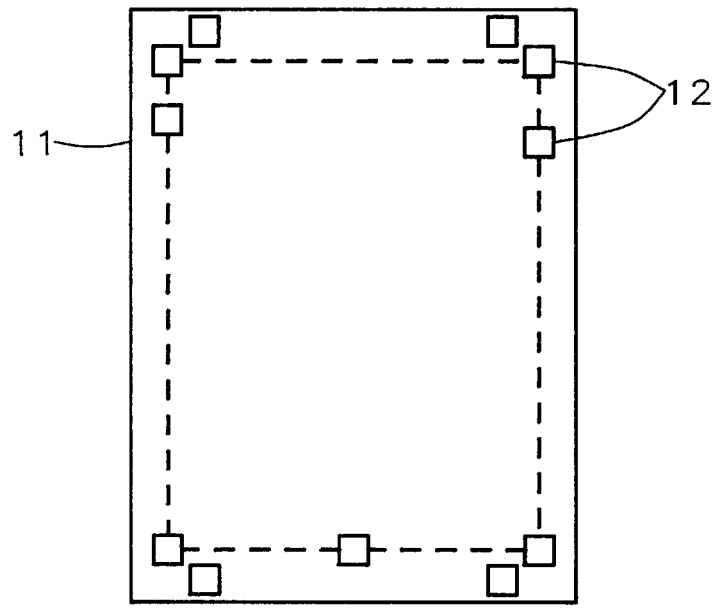
FIG. 1
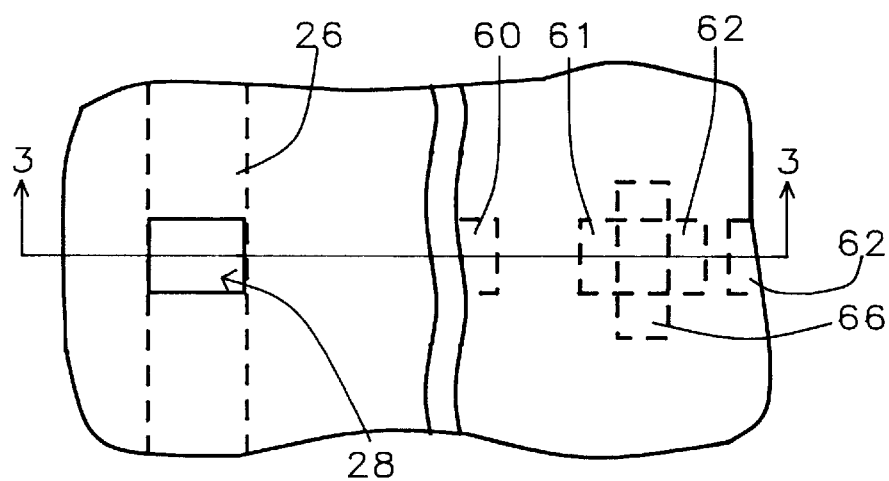
FIG. 2 - Prior Art

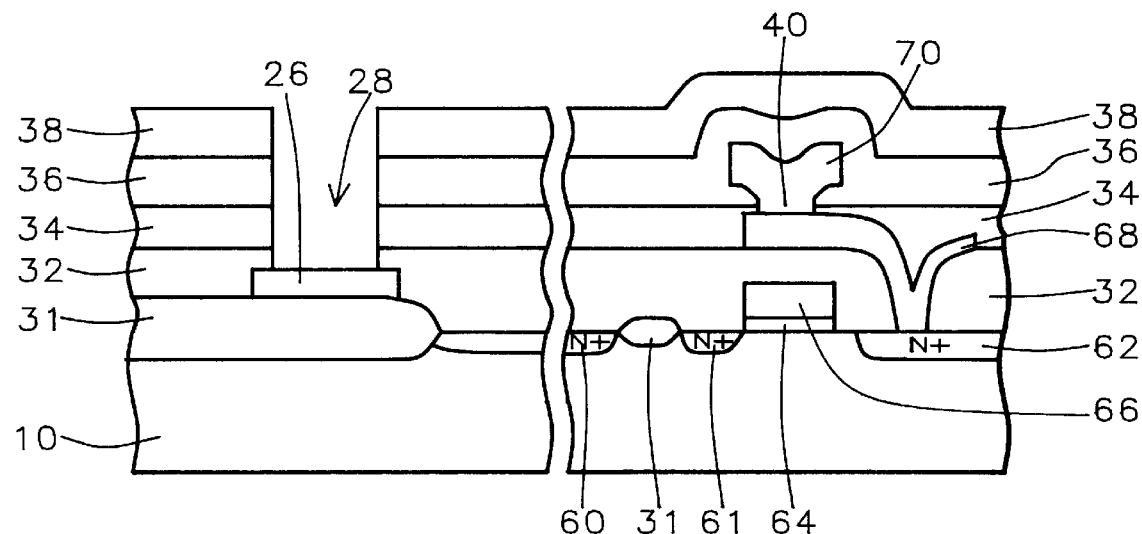
FIG. 3 - Prior Art
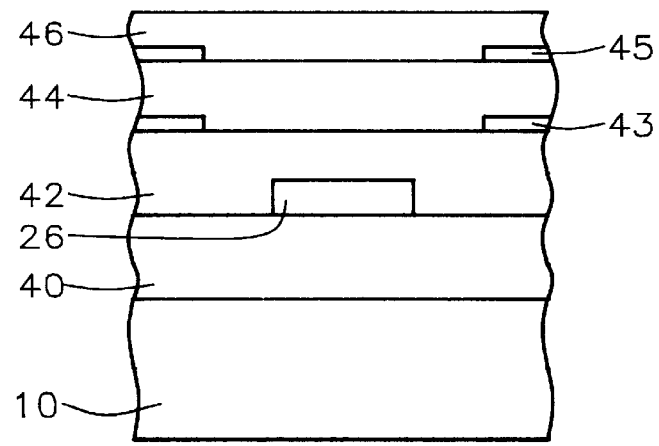
FIG. 4

METHOD OF MAKING AN INTEGRATED CIRCUIT HAVING AN OPENING FOR A FUSE

BACKGROUND OF INVENTION

1) Field of the Invention

This invention relates to integrated circuits and semiconductor devices. It relates particularly to a structure and method for producing integrated circuits having improved openings for fusible links.

2) Description of the Prior Art

Semiconductor chips often have openings over fusible link regions which frequently lower chip yields and reliability by allowing contamination to penetrate from the openings to the device regions. Fusible conductive links are used to rewire electrical circuits to replace defective devices with redundant devices. These circuits are rewired by rendering the fuses non-conductive (i.e. blown) by applying laser energy to the fuse with a laser repair machine.

In dynamic or static memory chips, defective memory cells may be replaced by blowing the fuses associated with the defective cells, and then activating a spare row or column of cells. The spare cells can be activated by blowing fuses using a laser or passing a high current through the fuse. This circuit rewiring using fusible links increases yields and reduces the production costs.

Logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

An important challenge is to improve the reliability of the semiconductor devices surrounding fusible links, especially when a large number of the fuses are on a chip. A major problem with fusible links is that moisture and other contaminates can diffuse from the openings in the insulating layers in the fuse regions into the device areas thus reducing circuit reliability and yields.

FIG. 1 shows a top plan view of a semiconductor chip 11 with fusible links regions 12. A conventional fusible link 26, opening 28 and an adjacent device regions 60, 61, 62 are shown in FIG. 2. Referring to FIG. 3, a cross-sectional view of the fuse 26 and device regions taken along horizontal axis labeled 3 is shown. Additional layers, especially metal layers may be present but are not illustrated in the Figs.

Fuse 26 is normally formed over a thick field oxide region 31 in semiconductor substrate 10. In addition, fuse 26 is formed over the field oxide region 31 to prevent shorting of the fuse 26 to the substrate 10 through a thinner insulating layer. Fuse 26 can be formed of a metal, such as aluminum, platinum silicide, or titanium tungsten; polysilicon; or a polycide, such as titanium polycide, tungsten polycide, or molybdenum polycide. Layers 32, 34, 36, 38 are insulating layers, such as borophosphosilicate glass, spin on glass, silicon oxide, and silicon nitride respectively. Opening 28 is formed over the fuse area through the insulating layers 32, 34, 36, 38. Generally, opening 28 can have a width in the range of 5 microns and a length of 5 microns. An adjacent semiconductor device is shown with buried N+ regions 60, 61, 62 isolation oxide 31, gate oxide 64, gate 66, via 40, and metal layers 68 70.

A laser can be used to "blow" the fuse rendering the fuse non-conductive. The laser is focused through an opening in the insulation layers over the fuse and irradiates the fuse. The fuse absorbs the heat from the irradiation, melts and the melted polysilicon fuse is removed by evaporation. In this operation, sometimes called laser trimming, the rapid temperature rise of the upper portion of the fuse causes an increase in pressure which can cause any overlying film 32 to be "blown off." The portion of the fuse and thin insulating layer which is melted away or "blown" must not deposit on or interfere with near-by devices. Laser trimming requires that only a very thin insulation layer covers the fuse because the laser must be able to be penetrate the layer and melt the fuse.

Because fuse melting is more efficient if the laser beam is not reduced by travel through intervening layers, it is conventional to have an opening 28 over the fuse in the area where the fuse will be heated. Because overlying layers would inhibit the laser, the passivation layers are normally opened to a single insulating layer covering the fuse 26. In the example shown in FIG. 3, an opening 28 is formed over fuse 26 through overlying layers: silicon nitride 38, silicon oxide 36 and inter-metal dielectric layer 34.

A major problem with any window opening in the passivation layers is that moisture and contaminates can enter through the exposed insulation layers and diffuse to the semiconductor devices. The diffused moisture and contaminates can decrease semiconductor device reliability and yields. Sources of contamination are all around; moisture is present in the air and sodium (Na+ ions) are plentiful in the environment.

As shown in FIG. 3, moisture and other contaminates can enter through the window 28 into layer 34 and diffuse through the layer 34 to the adjacent semiconductor devices 31 60 64. Two major problems which reduce chip yield can result: a) water can attack metal via's and b) sodium and other contaminates can harm metal oxide semiconductor (MOS) devices.

First, water can attack the metal via 40, with the following chemical reaction:

$3\ H_2O + Al \rightarrow Al(OH)_3 + 3/2\ H_2$

The resulting aluminum oxide in the via 40 can increase the resistance which can cause circuit failure.

Second, contamination can also harm MOS devices. FIG. 3 shows an opening 28, buried N+ regions 60 61 62, field oxide 31, gate oxide 64, polysilicon gate 66, and metal layers 68 70. Mobile ions, such as sodium ions, can diffuse through inter-metal dielectric layer 34, and through the insulating layer 32 into the field oxide layer 31. Mobile ions in the field oxide layer 31 can cause field inversion which can result in undesired leakage current between adjacent buried N+ regions 60, 61 resulting in circuit failure. Also, mobile ions in the gate oxide 64 will cause a transistor threshold shift whereby circuit failures can occur.

The following three U.S. patents show fusible link structures, but do not solve the problems of moisture and contaminates diffusing through the window opening into the insulating layers and devices.

Billig et all, U.S. Pat. No. 5,025,300 discloses a method of forming a very thin protective insulating layer over the fuse in a window. In another embodiment, the thin protective insulating layer is formed after the fuse is blown. This invention prevents shorts between conductors that otherwise might occur due to debris from the fuse-blowing operation. However, the problem of moisture and contaminates diffusing through the insulating layers in the window opening still exists. Moreover, the protective insulting layer over the fuse degrades the laser irradiation on the fuse.

Takayama, U.S. Pat. No. 4,536,949 discloses a method of forming openings over fuses where each insulation layer is etched separately yielding a more accurate opening. However, the problem of contaminates diffusing to the devices through the exposed sidewalls of the opening still exists.

Motonami, U.S. Pat. No. 5,241,212 discloses a protective layer covering an opening through a single insulating layer for a fuse. In one embodiment, the protective layer only covers the surface of the protective layer, but leaves the sidewall of the insulating layer exposed for moisture and contaminates to diffuse through. In a second embodiment, the protective coating covers the top of the isolation layer, the sidewalls of the fuse opening and also covers the isolation layer over the fuse and the fuse. Unfortunately, the protective layer over the fuse inhibits the laser from heating the fuse which can cause problems in consistently successfully blowing the fuses. A solution must be found that prevents contaminates from entering into the sidewalls of the insulation layers, but does not inhibit the laser trimming operation.

SUMMARY OF THE INVENTION

It is a general object of the invention to provide an improved structure and method for forming an opening in insulating layers over a fuse that prevents moisture and contaminates from diffusing through the opening to adjacent semiconductor devices.

It is a further object of the invention to provide an improved structure and method for forming a protective layer over the sidewalls of an opening in insulation layers over a fuse which prevents contamination from diffusing through the opening to semiconductor devices and which does not interfere with laser trimming of fuses.

In accordance with the above objects, a structure and technique for forming an protective layer over the sidewalls of a fusible link opening is provided. A first insulation layer is formed on a semiconductor substrate. Next, a fuse is formed on the first insulating layer. Several insulation layers are formed over the fuse and first insulating layer. A window opening over the fuse is formed in the isolation layers which either exposes the fuse or exposes a portion of the second insulation layer over the fuse.

A protective layer is formed over the top isolation layer, the opening sidewalls and portions of exposed second isolation layer, but not directly over the fuse. This protective isolation layer prevents contamination from entering into the isolation layer but does not interfere with the laser trimming of the fuse.

BRIEF DESCRIPTION OF THE DRAWINGS

The drawings show the following:

FIG. 1 is a top plan view in greatly enlarged scale that illustrates fusible links, fuse windows and adjacent semiconductor devices on a semiconductor chip.

FIG. 2 is plan view in broken section in greatly enlarged scale that illustrates a fusible link, a fuse window and adjacent semiconductor devices in accordance with the prior art process.

FIG. 3 is cross-sectional view along axis 3 in FIG. 2, in broken section in greatly enlarged scale that illustrates a fuse opening in accordance with the prior art process.

FIG. 4 is a cross-sectional view in broken section that illustrates a process for forming a fuse opening in accordance with the invention.

DETAILED DESCRIPTION OF THE PREFERRED EMBODIMENTS

Figure 5:
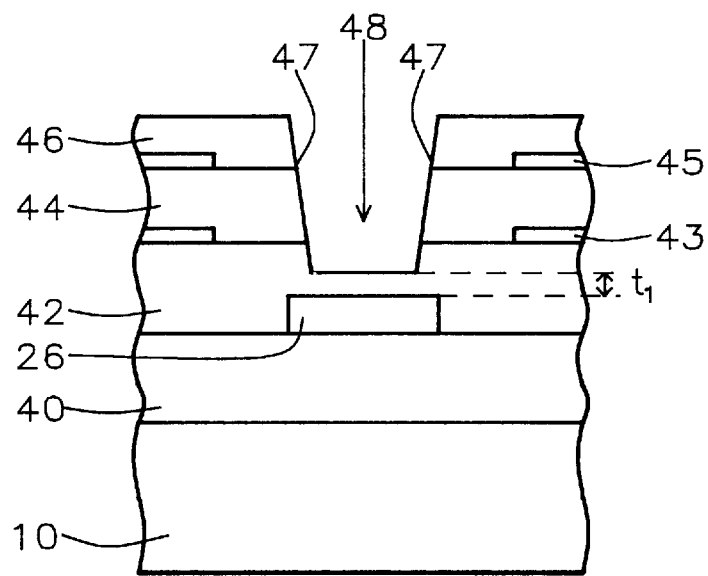
FIG. 5 is cross-sectional view in broken section that further illustrates a process for forming a fuse opening in accordance with the invention.

The following detailed description relates to an improved structure and technique for forming a fusible link opening for integrated circuits.

The method of the present invention will be described as an opening over a fuse and not by way of limitation. The opening and protective layer can be applied to other structures such as alignment mark regions. Moreover, in this description the fuse is illustrated on top of the first insulating layer, but in practice the fuse may be located on any insulating layer in the integrated circuit. Furthermore, although five insulating layers and two metal layers are described herein, in practice the actual number and composition of the layers may vary. Also, the Figs. are not drawn to scale.

Referring to FIG. 4, a first isolation layer 40 is formed on portions a semiconductor substrate 10. First isolation layer 40 electrically isolates adjacent semiconductor devices from each other. The first insulation layer 40 is preferably formed of thick silicon oxide, is sometimes called field oxide. Silicon oxide can be grown at atmospheric pressure at 700° to 1200° C. in a wet or dry oxygen ambient in a thermal furnace. Layer 40 has a thickness in the range of 2000 to 8000 angstroms and preferably a thickness of approximately 5000 angstroms.

A fusible link 26 is formed over the field oxide 40 because the field oxide 40 isolates the fusible link 26 from adjacent devices and most importantly, from the substrate 10. Fuse 26 can be formed of a metal, such as platinum silicide or titanium tungsten, or polysilicon. Also, fuse 26 can be formed of a polycide such as titanium polycide, tungsten polycide, molybdenum polycide. Fuse 26 typically has a thickness in the range of 500 to 5000 angstroms, a length in the range of 5 to 10 microns and a width in the range of 1 to 3 microns. Fuse 26 can be "blown" by applying laser energy to allow redundant circuit devices to be activated and replace defective devices.

Next, a second insulating layer 42 is formed over the fuse 26 and the first insulating layer 40. Second insulating layer 42 can be formed of borophosphosilicate glass, phosphosilicate glass, silicon oxide or other suitable insulating material. Borophosphosilicate glass can be formed by low pressure chemical vapor deposition (LPCVD) of tetraethylorthosilicate (TEOS). Boron and phosphorus can be added to the ambient during the formation of the borophosphosilicate glass layer. The layer 42 is thermally treated at a temperature of 850° C. for 30 minutes to cause flow and planarization. Second insulating layer 42 can have thickness in the range of 3000 to 15,000 angstroms and preferably a thickness of approximately 6000 angstroms.

Subsequently, a first metal layer 43 is deposited over the second insulating layer 42. First metal layer 43 can be formed of films of Ti/TiN/AlCu/TiN and can have an overall thickness of approximately 5650 Å.

Afterwards, a third insulating layer 44 is formed overlying the first metal layer 43. Moreover, third insulating layer 44 has a thickness in the range of 5000 to 20,000 angstroms and preferably a thickness of approximately 10,000 angstroms.

Third insulating layer 44 can be formed of at least three materials. First, layer 44 can be formed of spin on glass (SOG). Spin on glass layers can be formed using a siloxane or silicate, which is deposited, baked and cured at approximately 400° C.

Second, layer 44 can be formed by making a three layer sandwich structure of a) silicon oxide, b) spin on glass and c) silicon oxide. The underlying silicon oxide layer can be deposited by a plasma enhanced chemical vapor deposition (PECVD), followed by deposition of an intermediate layer of spin on glass, and followed by a top silicon oxide layer deposited by plasma enhanced chemical vapor deposition (PECVD). The bottom silicon dioxide layer can be deposited using PECVD by reacting silane and nitrous oxide in an argon plasma at 200° to 450° C. The bottom silicon dioxide layer has a thickness of approximately 2000 Angstroms. The middle spin on glass (SOG) layer can be formed using a siloxane or silicate, which is deposited, baked and cured at approximately 400° C. The middle spin on glass layer can have a thickness of approximately 3000 Angstroms (Å). The top silicon oxide layer can have a thickness of approximately 5000 angstroms and is formed using the same processes described above for the bottom silicon oxide layer. The overall thickness of layer 44 is in the range of 5000 to 20,000 angstroms.

Third, layer 44 can alternately be formed using a three layer structure. First, spin on glass is deposited and partially etched back by 1000 angstroms to a thickness of 3000 angstroms. Next, silicon oxide is deposited by plasma enhanced chemical vapor deposition (PECVD) which can be etched back. The third layer can be formed of silicon oxide using TEOS or a combination of TEOS and spin on glass. The third layer can also be etched back if desired.

Consequently, a second metal layer 45 is formed over the third insulating layer 44. Second metal layer 45 can be formed of Ti/AlCu/TiN. The Ti film can have a thickness of approximately 1500 Å, the AlCu film can have a thickness of approximately 6000 Å, and the TiN film can have a thickness of approximately 250 Å.

As shown in FIG. 4, a fourth insulating layer 46 is formed over the second metal layer 45. Layer 46 can be formed of silicon oxide, silicon nitride, or a combination of silicon oxide and silicon nitride, deposited by plasma enhanced chemical vapor deposition (PECVD). Layer 46 has a thickness in the range of 1000 to 10,000 angstroms and preferably a thickness of 5000 angstroms.

Referring to FIG. 5, an opening 48 over fuse 26 is formed with substantially vertical sidewalls exposing portions of the second 42, third 44 and fourth 46 insulating layers. Opening 48 can extend down to fuse 26 thus exposing the fuse. Also, the opening 48 may extend through a portion of the second insulating layer 42 leaving a portion of the second insulating layer 42 remaining over the fuse as shown in FIG. 5. The thickness of the remaining second insulating layer 42 over the fuse 26 is indicated in FIG. 5 as "$t_1$". Opening 48 can be formed using conventional photolithography and etching techniques. For example, the third insulating layer 46 can be etched using a $SF_6/CHF_3/Ar$ anisotropic plasma etch. Moreover, a second insulating layer 44 formed of oxide/spin on glass/oxide can be etched using a $CF_4/CHF_3/Ar$ plasma etch.

The thickness $t_1$ of the second insulating layer 42 overlying the fuse 26 is in the range of 0 to 15,000 angstroms. The thickness $t_1$ should be small and tightly controlled to allow the laser irradiation to consistently penetrate the film 42 to consistently melt the fuse without overheating and damaging the surrounding insulating layers 40, 42, 44, 46 and devices.

Figure 6:
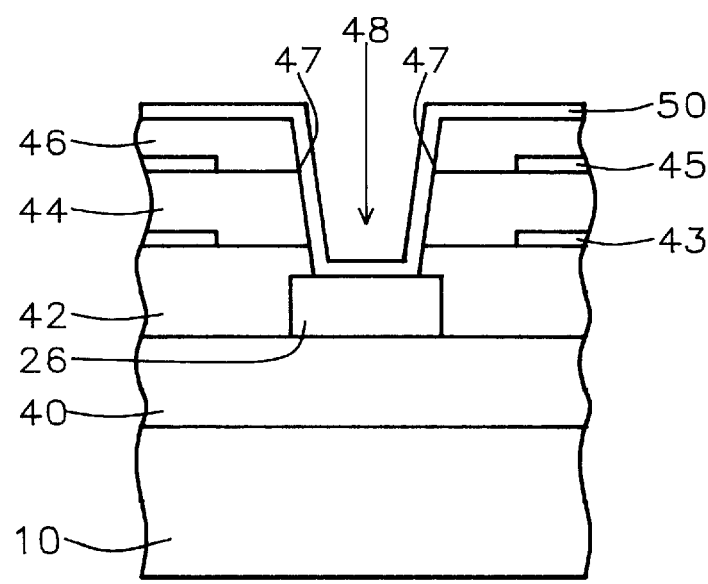
FIG. 6 is cross-sectional view in broken section that illustrates a process for forming a fuse opening in accordance with the invention.

Next, a protective film 50 is deposited over the fourth layer 46; the exposed portion of the second 42, and third 46 layers of the sidewalls 47 in the opening; 48 and the fuse 26, as shown in FIG. 6. Protective film 50 can be formed of plasma enhance chemically deposited (PECVD) silicon nitride. Silicon nitride can be formed by plasma enhanced chemical vapor deposition (PECVD) by reacting silane with ammonia or nitrogen in a glow discharge between 200° and 450° C. Layer 50 has a thickness in the range of 2000 to 20,000 angstroms and more preferably a thickness of 7000 angstroms. Also, layer 50 can be formed of silicon nitride, oxynitride, or a combination of silicon oxide and nitride. It is desirable that protective layer 50 have a low diffusivity and a low pin hole density to insure the layer integrity.

Figure 7:
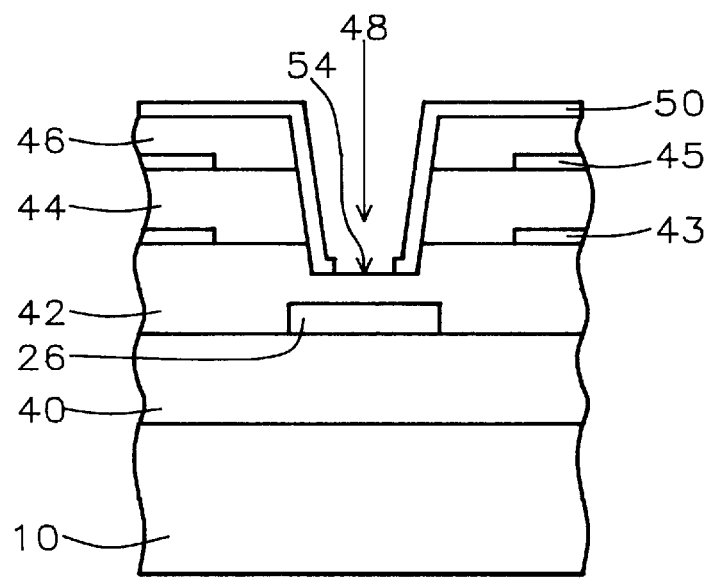
FIG. 7 is cross-sectional view in broken section that illustrates another embodiment of a process for forming a fuse opening in accordance with the invention.

As shown in FIG. 7, opening 54 is formed in the protective layer 50 at least exposing the second insulating layer 42 over the fuse 26. The opening 54 is formed by conventional photolithographic and etch processes. A laser beam can pass through opening 54 without interference and can heat the fuse 26.

This invention has the benefit of increasing semiconductor device yield by reducing moisture and contamination which can enter fuse openings and attack devices. The protective layer of the invention prevents contamination from entering the exposed portion of the insulating layers 44 46 in the sidewalls 47. In addition to preventing contamination diffusion, the invention does not interfere with the laser trimming process since the opening 54 in the protective layer 50 allows the laser beam to pass through without interference.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a contamination resistant opening for a fuse link on a semiconductor substrate comprising:
   forming a first insulating layer over portions of the substrate;
   forming a fuse link on the first insulating layer;
   forming a second insulating layer over the fuse link and the first insulating layer;
   forming a third insulating layer overlying the second insulating layer;
   forming a fourth insulating layer overlying the third insulating layer;
   forming a first opening over the fuse with vertical sidewalls, the first opening extending through the second, third and fourth insulating layers; said first opening exposing a portion of said fuse;
   forming a protective layer over the fourth insulating layer, over at least the sidewalls of the first opening, and the exposed portion of the fuse; said protective layer is formed of silicon nitride having a thickness in the range of 3000 to 20,000 angstroms; and
   forming a second opening in the protective layer over the fuse thus exposing portions of said fuse.

2. The method of claim 1 wherein the first insulation layer is formed of silicon oxide having a thickness in the range of 2000 to 8000 angstroms.

3. The method of claim 1 wherein the second insulation layer is formed of borophosphosilicate glass having a thickness in the range of 3000 to 15,000 angstroms.

4. The method of claim 1 wherein the third insulation layer is formed of composite layer consisting of silicon oxide, spin on glass, and silicon oxide having an overall thickness in the range of 5000 to 20,000 angstroms.

5. The method of claim 1 wherein the fourth insulation layer is formed from a material selected from the group consisting of silicon oxide, silicon nitride, and a combination of silicon oxide and silicon nitride; the fourth layer having a thickness in the range of 1000 to 10,000 angstroms.

6. The method of claim 1 which further comprises forming a first metal layer over the second insulating layer.

7. The method of claim 6 which further comprises forming a second metal layer over the third insulating layer.

* * * * *